US011942504B2

(12) United States Patent
Hu (10) Patent No.: US 11,942,504 B2
(45) Date of Patent: Mar. 26, 2024

(54) STACK CHIP AIR GAP HEAT INSULATOR (71) Applicant: OMNIVISION TECHNOLOGIES, INC., Santa Clara, CA (US)

(72) Inventor: Sing-Chung Hu, San Jose, CA (US)

(73) Assignee: OMNIVISION TECHNOLOGIES, INC., Santa Clara, CA (US)

(*) Notice: Subject to any disclaimer, the term of this patent is extended or adjusted under 35 U.S.C. 154(b) by 0 days.

(21) Appl. No.: 17/819,821

(22) Filed: Aug. 15, 2022

(65) Prior Publication Data
US 2022/0392943 A1 Dec. 8, 2022

Related U.S. Application Data (62) Division of application No. 16/597,762, filed on Oct. 9, 2019, now Pat. No. 11,456,328.

(51) Int. Cl.
H01L 27/146 (2006.01)
H01L 23/467 (2006.01)
H01L 31/024 (2014.01)

(52) U.S. Cl.
CPC ...... H01L 27/14636 (2013.01); H01L 23/467 (2013.01); H01L 27/14634 (2013.01); H01L 27/1469 (2013.01); H01L 31/024 (2013.01)

(58) Field of Classification Search
CPC ............. H01L 27/14636; H01L 23/467; H01L 27/1469; H01L 31/024; H01L 27/14634; H01L 2224/0603
USPC ............. 257/23.099, 706, 707, 717; 438/107
See application file for complete search history.

(56) References Cited

U.S. PATENT DOCUMENTS

2009/0057879 A1  3/2009  Garrou et al.
2011/0031633 A1  2/2011  Hsu et al.
2014/0104474 A1* 4/2014  Tange ............... H01L 27/14623
                                                      438/69
2014/0145338 A1  5/2014  Fujii et al.
(Continued)

FOREIGN PATENT DOCUMENTS

JP    2008-078419 A    4/2008
TW    201304064 A1    1/2013
(Continued)

OTHER PUBLICATIONS

Taiwan Office Action dated Oct. 23, 2023, issued in related Taiwan Application No. 109132521 filed Sep. 21, 2020, 9 pages.

Primary Examiner — David Chen
(74) Attorney, Agent, or Firm — Christensen O'Connor Johnson Kindness PLLC (57) ABSTRACT Image sensors include a pixel die that is stacked on a logic die. The logic die includes at least one function logic element disposed on a bond side thereof, and a logic oxide array of raised logic oxide features also disposed on the bond side. The pixel die includes a pixel array disposed on a light receiving side thereof, and a pixel oxide array of raised pixel oxide features disposed on a bond side of the pixel die. A plurality of outer bonds is disposed between an outer region of the logic die and an outer region of the pixel die. A plurality of inner bonds is formed at an inner region of the image sensor between the pixel oxide array and the logic oxide array, the inner bonds being spaced apart by a plurality of fluidly connected air gaps that extend between the logic die and the pixel die.

13 Claims, 12 Drawing Sheets (56) References Cited

U.S. PATENT DOCUMENTS

| | | | |
|---|---|---|---|
| 2014/0264698 A1* | 9/2014 | Huang | ................. H01L 31/024 |
| | | | 257/433 |
| 2014/0264948 A1 | 9/2014 | Chou et al. | |
| 2016/0111386 A1 | 4/2016 | England | |
| 2016/0181228 A1* | 6/2016 | Higuchi | .............. H01L 25/0657 |
| | | | 257/774 |
| 2017/0365755 A1* | 12/2017 | Chu | ........................ H01L 33/62 |
| 2020/0075534 A1 | 3/2020 | Gao et al. | |

FOREIGN PATENT DOCUMENTS

| | | |
|---|---|---|
| TW | 201622121 A | 6/2016 |
| TW | 201926734 A | 7/2019 |

\* cited by examiner

STACK CHIP AIR GAP HEAT INSULATOR

CROSS-REFERENCES TO RELATED APPLICATIONS

This application is a divisional application of U.S. patent application Ser. No. 16/597,762 filed Oct. 9, 2019, now U.S. Pat. No. 11,456,328 issued Sep. 27, 2022, which is incorporated herein in its entirety.

BACKGROUND INFORMATION

Field of the Disclosure

This disclosure relates generally to image sensors, and in particular but not exclusively, relates to image sensor stacked chipsets.

Background

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

CMOS image sensors (CIS) may utilize stacked architecture having a plurality of chips placed atop one another. Such stacked architecture advantageously consolidates the size of the CIS and may shorten the lengths of some circuit connections. For example, a CIS may include a pixel chip that is stacked together with a logic chip. The pixel chip may be configured to receive light on an array of pixels, which generates charge in the pixels. The logic chip may include readout circuitry, analog-to-digital conversion circuity, and additional logic circuitry.

In CIS with stacked architecture, the functional components of the logic chip may generate significant heat loads. Heat generated from the logic chip will dissipate to the neighboring stacked pixel chip, which can cause a local dark current (DC) increase and result in Dark Image Non-Uniformity (DINU) — an undesirable form of noise that is prevalent when pixels do not receive significant light intensity but nevertheless generate charge. DINU is even more prevalent in hot operating environments, e.g., automotive applications.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

An appendix is included herewith to preserve detail shown in the FIGS. 9A-9B.

DETAILED DESCRIPTION

Examples directed to stacked chip architecture are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics of embodiments may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

To facilitate understanding, the present disclosure describes the invention in the context of complementary metal-oxide-semiconductor ("CMOS") image sensors (CIS). However, it shall be appreciated that the invention shall not be limited to CIS, but may be applied to non-CMOS image sensors having stacked chip architecture and other semiconductor devices having stacked chip architecture.

Figure 1:
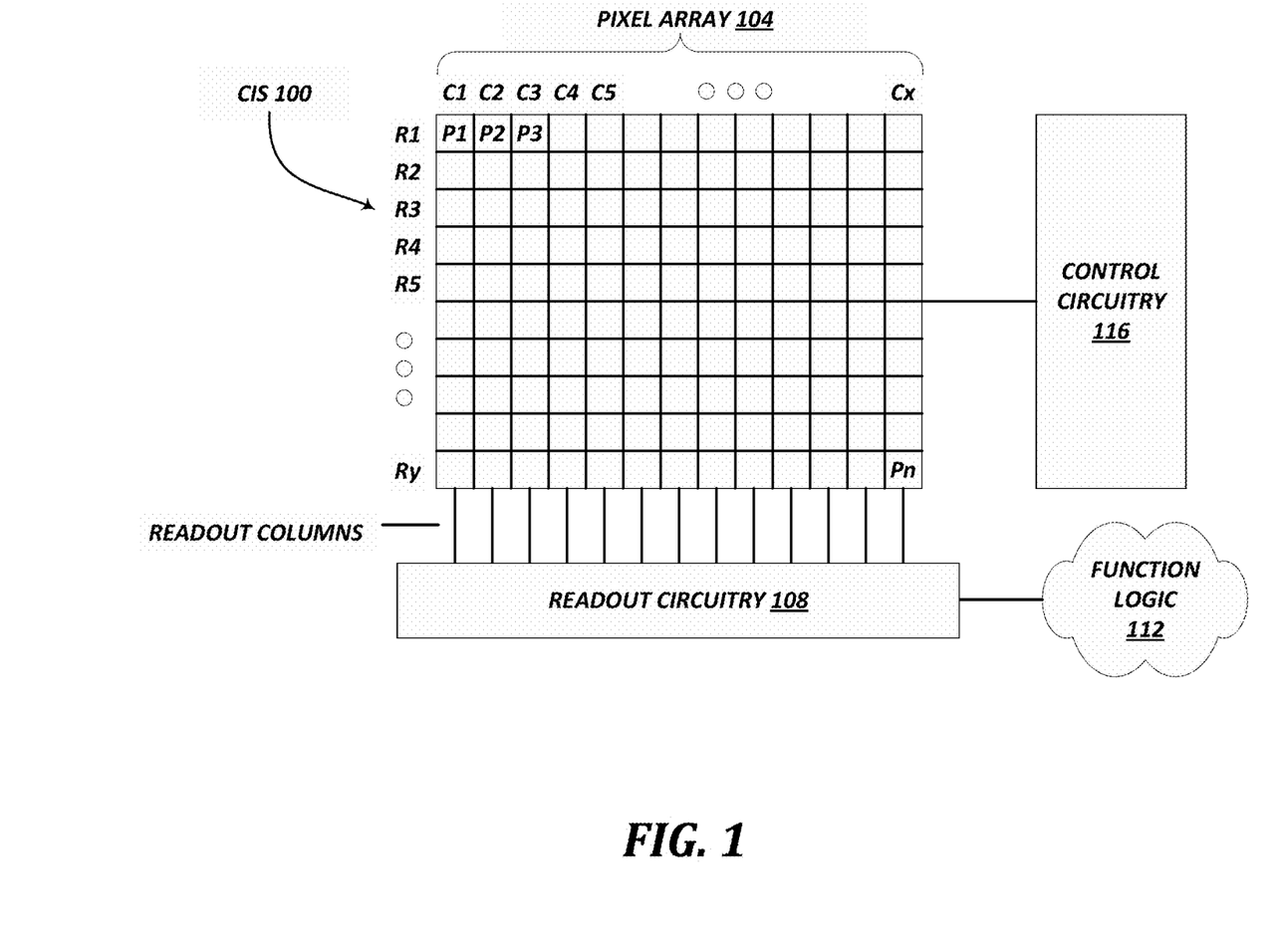
FIG. 1 is a functional block diagram illustrating an embodiment of an image sensor (CIS) in accordance with the teachings of the present disclosure.

FIG. 1 is a functional block diagram illustrating an embodiment of a CIS 100, in accordance with an embodiment of the present disclosure. CIS 100 may be one implementation of a semiconductor device, such as an integrated circuit having stacked device wafers, as described below. CIS 100 includes a pixel array 104, readout circuitry 108, function logic 112, and control circuitry 116.

Pixel array 104 is a two-dimensional ("2D") array of backside illuminated imaging sensors or pixels (e.g., pixels P1, P2 . . . , Pn). In one embodiment, each pixel is an active pixel sensor ("APS"), such as a CMOS imaging pixel. As illustrated, each pixel is arranged into a row (e.g., rows R1 to Ry) and a column (e.g., columns C1 to Cx) to acquire image data of a subject (e.g., person, place, or object), which can then be used to render a 2D image of the person, place, or object.

After each pixel has acquired its image data or image charge, the image data is read out by readout circuitry 108 and transferred to function logic 112. Readout circuitry 108 can include amplification circuitry, analog-to-digital ("ADC") conversion circuitry, and/or other circuitry. Function logic 112 can store the image data or even manipulate the image data by applying post image effects (e.g., crop, rotate, remove red eye, adjust brightness, adjust contrast, or other post image effects). Such function logic 112 may be implemented by one or more logic elements, such as application specific integrated circuits (ASICs). Control circuitry 116 is coupled to pixel array 104 to control operational characteristics of pixel array 104. In one non-limiting example, control circuitry 116 may be coupled to generate a global shutter signal for controlling image acquisition for each pixel (e.g., P1, P2, P3, . . . Pn). In the example, the global shutter signal simultaneously enables all pixels within pixel array 104 to simultaneously transfer the image charge from each respective photodetector during a single acquisition window. The control circuitry 116 may control other operational characteristics of pixel array 104.

Semiconductor devices such as CIS 100 of FIG. 1 may be implemented in a stacked chip architecture, whereby a first semiconductor die is stacked on top of, and bonded to, a second semiconductor die. The first and second semiconductor dies may be bonded together by, for example, oxide surface level micro-bonds in the active pixel array. The first and second semiconductor dies may be bonded by hybrid bonds that achieve simultaneous metal-metal contact and dielectric-dielectric contact in the outer frame. Stacked chip architecture may advantageously reduce the form factor of the semiconductor device and enable additional features, such as permitting use of a greater photodiode-die area for photodiodes, and optimizing processing and materials of the first die for photodiodes, while optimizing processing of the second die for the supporting circuitry.

Figure 2A:
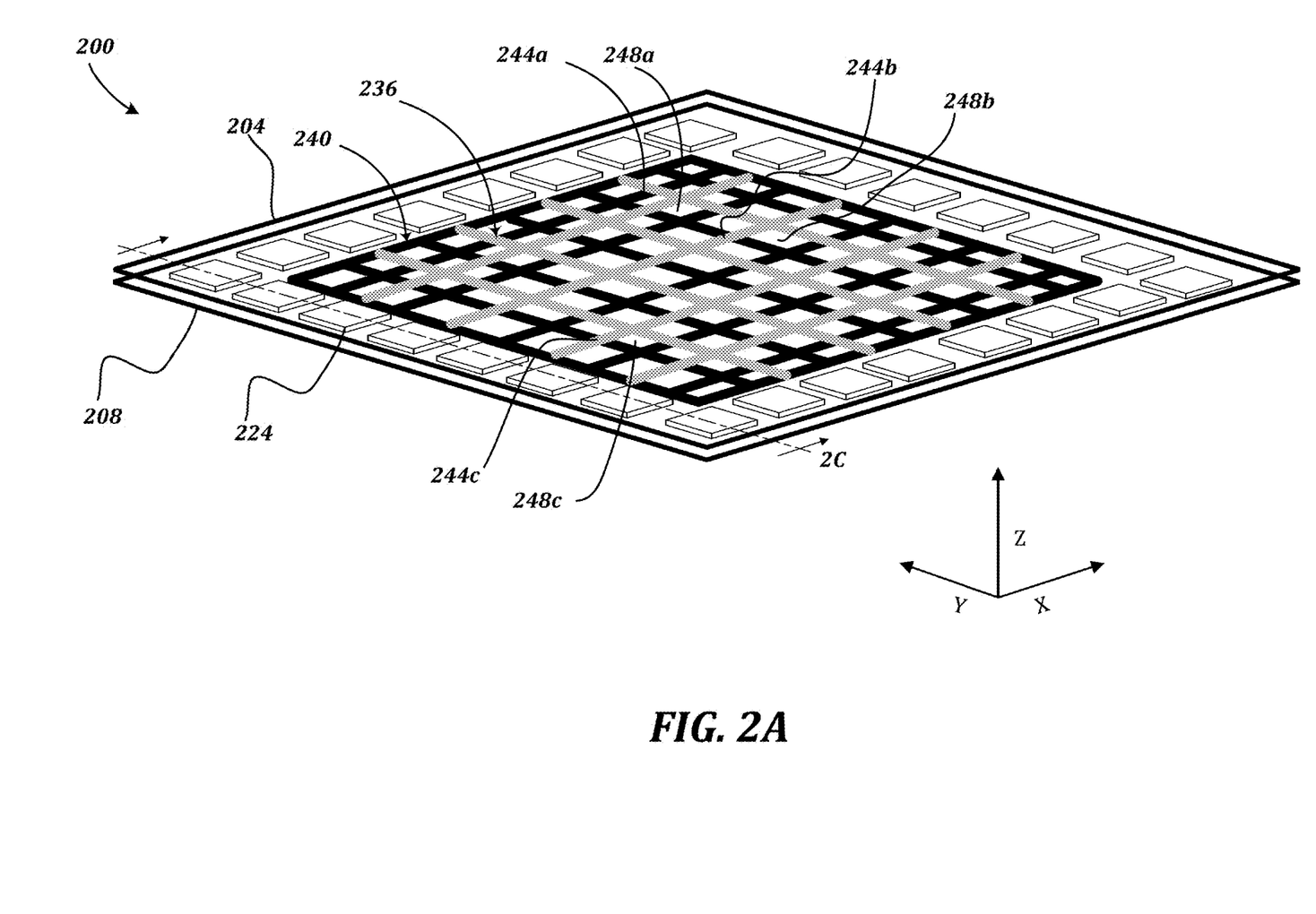
FIG. 2A illustrates an example image sensor having stacked chip architecture in accordance with the teachings of the present disclosure.
Figure 2B:
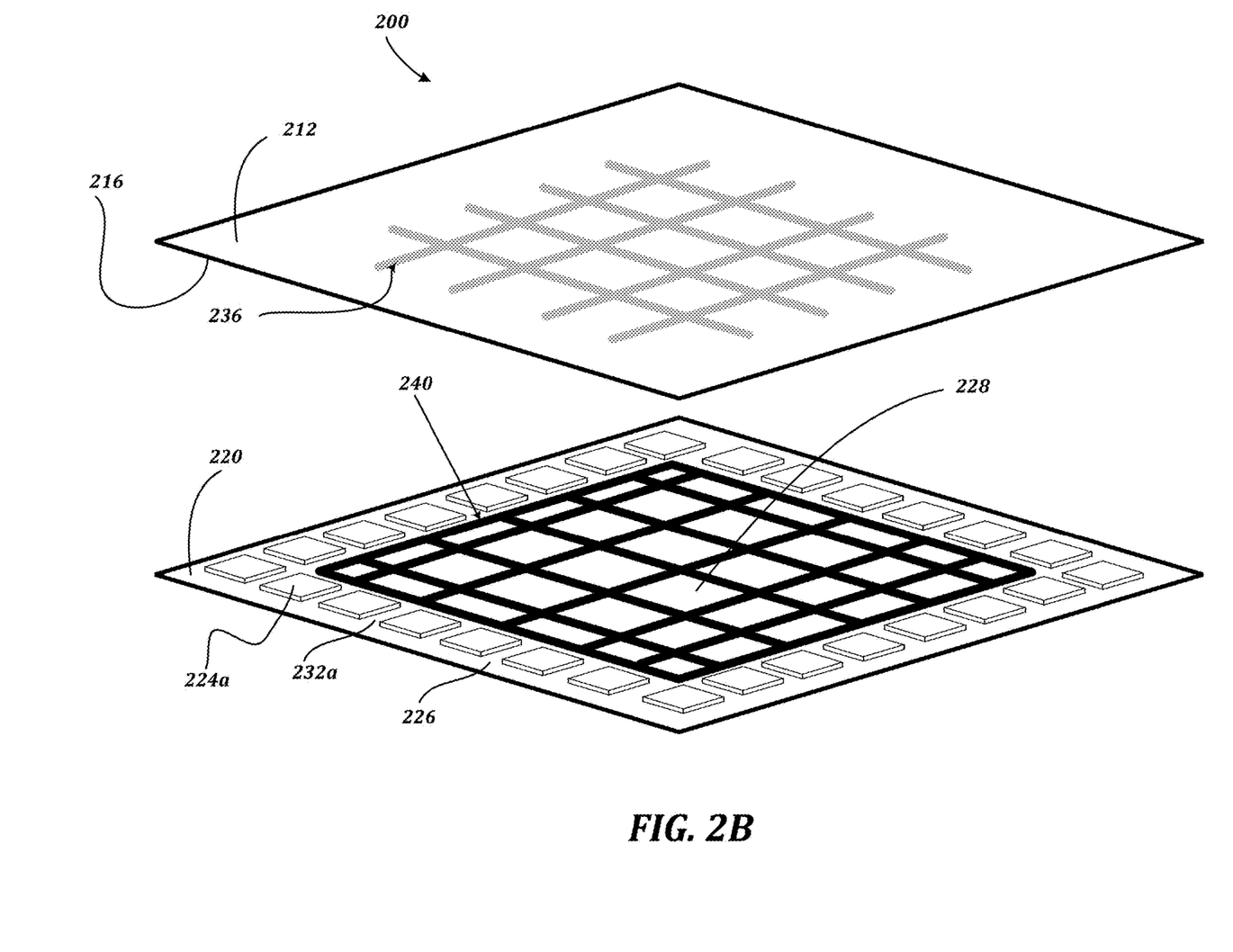
FIG. 2B shows a partially exploded view of the example image sensor of FIG. 2A.

FIGS. 2A-2B illustrate a CIS 200 having stacked chip architecture in accordance with the teachings of the present disclosure. The CIS 200 includes a pixel die 204 that is stacked on top of a logic die 208. In one example, the pixel die 204 includes a CIS pixel array similar to pixel array 104 of FIG. 1, and may also include other circuitry. In one example, the logic die 208 includes readout circuitry similar to readout circuitry 108 of FIG. 1, as well as a plurality of logic elements having function logic similar to function logic 112 of FIG. 1. In some embodiments, the logic die 208 may also embody control circuitry such as control circuitry 116 of FIG. 1. To facilitate understanding of the inventive aspects of the CIS 200, FIGS. 2A-2B do not show the pixel array, readout circuitry, function logic, and control circuitry to avoid obscuring the teachings of the present invention. However, it shall be understood that the pixel die 204 and logic die 208 may include these elements. In some embodiments, each of the pixel die and the logic die may each include additional circuitry.

FIG. 2B shows a partially exploded view of the CIS 200 of FIG. 2A, in which the pixel die 204 is exploded from the logic die 208 for clarity. The pixel die 204 has a light receiving side 212 that, in use, faces a subject to be captured by the pixel array (e.g., a person, place, or object). The pixel die 204 also has a pixel bond side 216 that is opposite of the light receiving side 212. The logic die 208 has a logic bond side 220 that faces the pixel bond side 216 of the pixel die 204. A plurality of outer bonds 224 (e.g., 224a) bond the pixel die 204 to the logic die 208 around an outer region 226 of CIS 200, which includes an outer region of the pixel die 204 and an outer region of the logic die 208 such that the outer bonds 224 surround an inner region 228 of the CIS 200, which includes an inner region of the pixel die 204 and an inner region of the logic die 208. In an embodiment, the inner region 228 encompasses a pixel array on the pixel die 204. In the illustrated embodiment, each outer bond 224 is a hybrid bond that achieves simultaneous metal-metal contact and dielectric-dielectric contact between the pixel die 204 and the logic die 208. In other embodiments, the outer bonds 224 may include one or more different bond types. CIS having a hybrid outer bond 224 may be referred to as a hybrid bond image sensor, or a hybrid bond CIS.

Figure 2C:
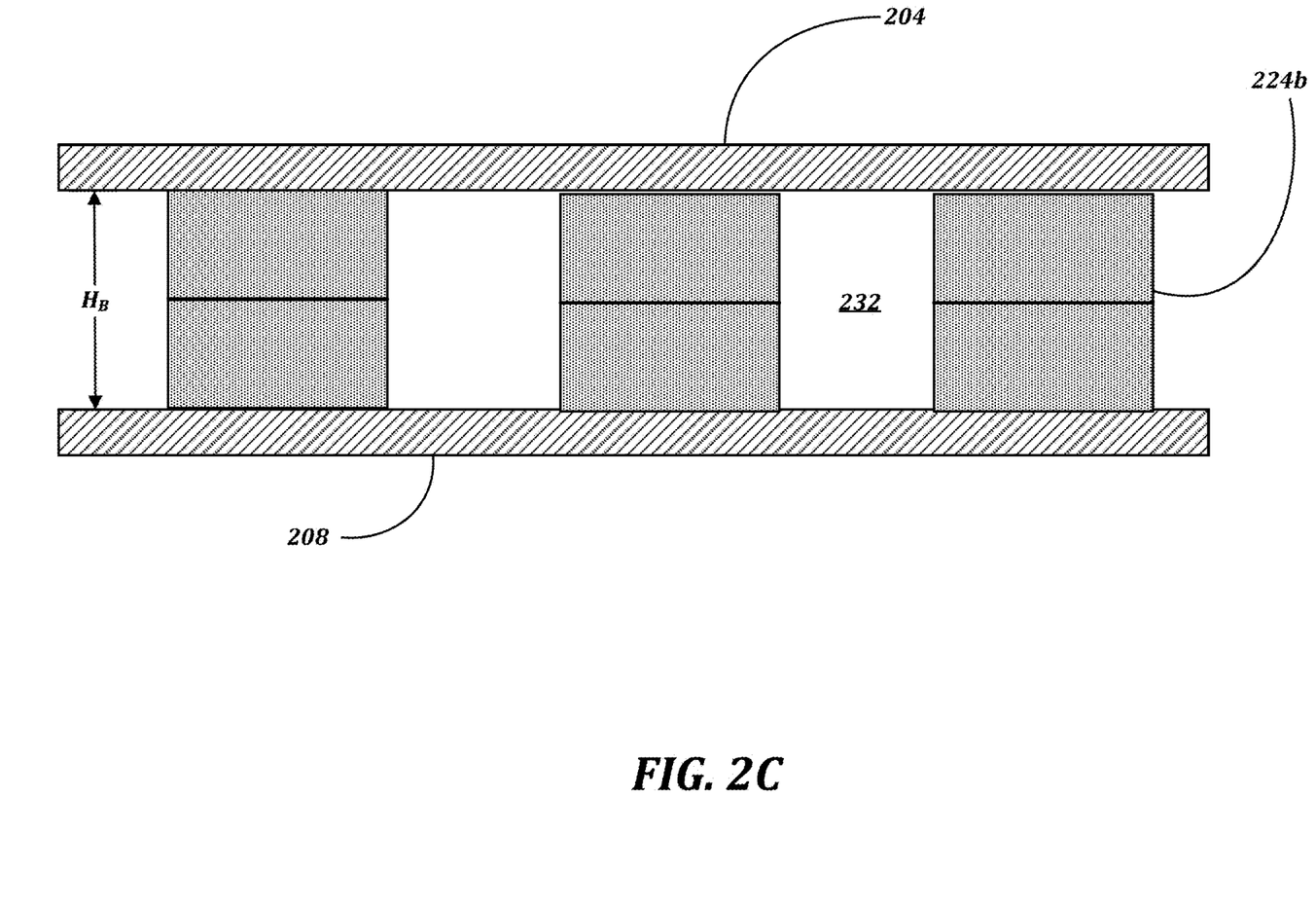
FIG. 2C shows a section view of the example image sensor of FIG. 2A.

FIG. 2C shows a partial schematic section view of the CIS 200 of FIG. 2A along section line 2C through outer bonds 224 including outer bond 224a in order to show other aspects of the CIS 200. Each outer bond 224 has a bond height $H_B$ of at least about 1 μm, e.g., at least about 2 μm, or about 1 μm to about 3 μm. In an embodiment, the bond height H is about 1 μm. In another embodiment, the bond height $H_B$ is about 2 μm. To clarify, bond height $H_B$ is the distance between the pixel die 204 and the logic die 208. As can be seen, adjacent outer bonds 224 (e.g., 224b) are separated by an air channel 232. As shown in FIG. 4, the air channel 232 (e.g., 232b and 232c) is fluidly connected to an air gap 248 between the pixel die 204 and the logic die 208. The air gaps will be described in detail below. Returning to FIG. 3, each air channel 232 has a width of about 150 μm to about 2000 μm. In use, each air channel 232 enables the exchange of air (or other gas) with the inner region 228 of CIS 200, thereby removing thermal energy from the inner region 228. In some embodiments, every air channel 232 is fluidly connected to an air gap.

Returning to FIGS. 2A-2B, the pixel die 204 includes a pixel oxide array 236 disposed on the pixel bond side 216 of the pixel die 204. Similarly, the logic die 208 includes a logic oxide array 240 disposed on the logic bond side 220 of the logic die 208. The pixel oxide array 236 and the logic oxide array 240 are configured to interface with each other at a plurality of inner bonds 244 (e.g., 244a, 244b, 244c) between the pixel die 204 and the logic die 208. Together, the plurality of inner bonds 244 supports the pixel die 204 atop the logic die 208 and secures the x-, y-, and z-direction positions of the pixel die 204 relative to the logic die 208. Further, the location and size of the inner bonds 244 impact the thermal characteristics of the pixel oxide array 236 and the logic oxide array 240.

The pixel oxide array 236 and the logic oxide array 240 facilitate the evacuation of thermal energy from between the pixel die 204 and the logic die 208 by separating the pixel die 204 from the logic die 208. In particular, the pixel oxide array 236 and the logic oxide array 240 partially define a plurality of fluidly connected air gaps 248 (e.g., 248a, 248b, and 248c shown in FIG. 2A) between the pixel die 204 and the logic die 208. Advantageously, these fluidly connected air gaps 248 limit heat transfer from the logic die 204 to the pixel die 208, and are described in detail below.

Figure 3:
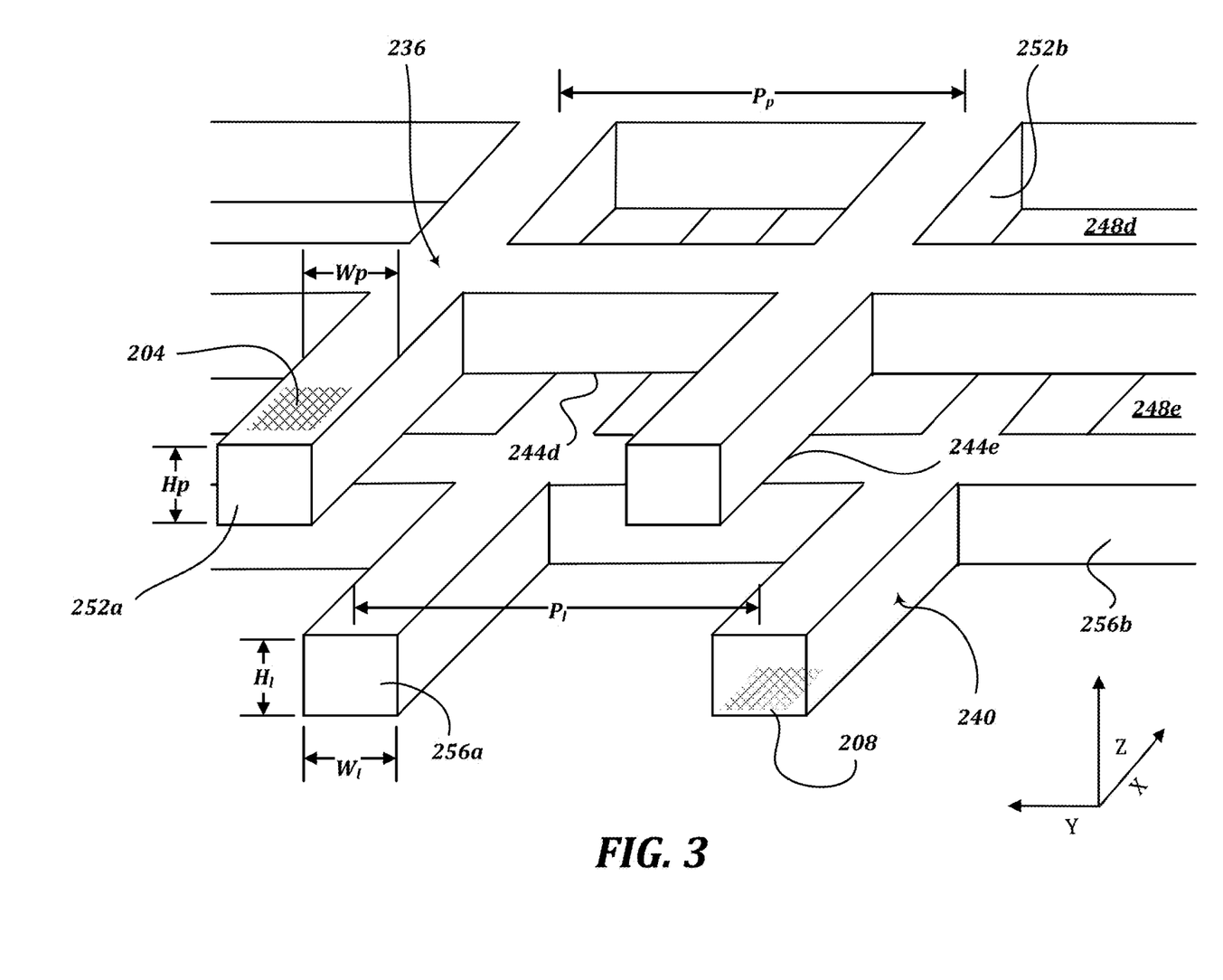
FIG. 3 shows a schematic perspective view of a pixel oxide array and a logic oxide array forming an example of plurality of fluidly connected air gaps, in accordance with the teachings of the present disclosure.
Figure 4:
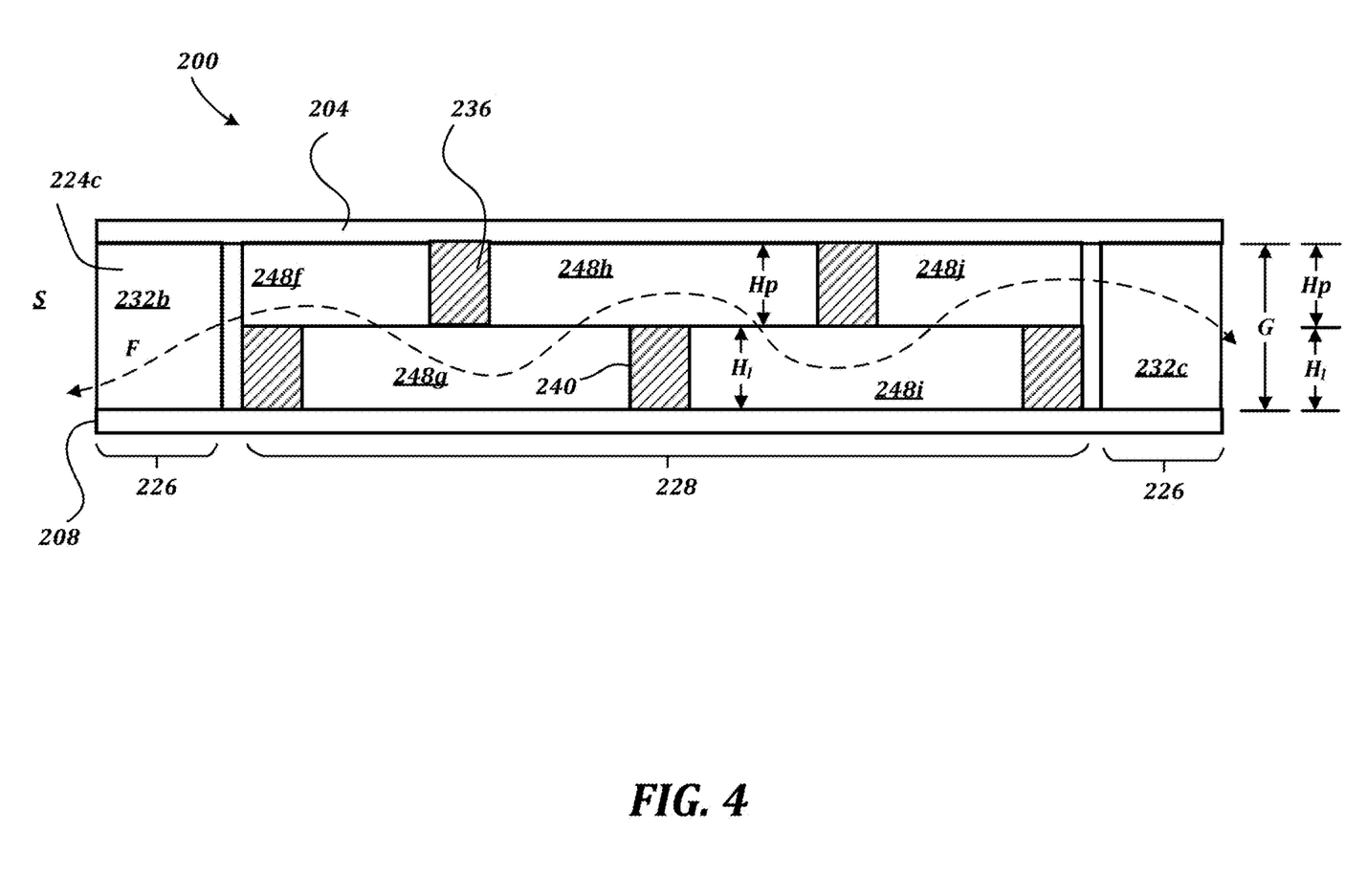
FIG. 4 shows a schematic section view of an example image sensor having stacked chip architecture in accordance with the teachings of the present disclosure.

Referring to FIG. 3, the pixel oxide array 236 is at least partially formed from a plurality of raised pixel oxide features 252 (e.g., 252a and 252b) that extend away from the pixel die 204. In the illustrated embodiment, the raised pixel oxide features 252 form a grid having a plurality of pixel oxide vertices, although in other embodiments, the raised pixel oxide features form non-grid shapes (e.g., "islands" or "stripes," as described below with respect to FIGS. 6-7, respectively). In all embodiments, the raised pixel oxide features 252 may be formed by an etching process, a deposition process, or another process. An exemplary process for forming the raised pixel oxide features 252 is described below.

Each raised pixel oxide feature extends away from the pixel die 204 by a height Hp of about 0.25 μm to about 1.75 μm. In an embodiment, each raised pixel oxide feature 252 has a height Hp of about 0.5 μm, which has been discovered to provide an advantageous level of spacing between the pixel die 204 and the oxide die 208, when bonded with a logic oxide die as described below. Each raised pixel oxide feature 252 has a width Wp of about 2.0 μm to about 5.0 μm. In an embodiment, each raised pixel oxide feature 252 has a width Wp of about 3.0 μm, which provides an effective level of mechanical strength and stress without creating an overly-detrimental effect on insulation between the pixel die 204 and the logic die 208.

In some embodiments, different raised pixel oxide features 252 may have different heights Hp, widths Wp, and/or other dimension across the pixel die 204, and/or relative to features of the logic oxide array 240, described below. Adjacent raised pixel oxide features 252 are spaced apart by pitch $P_p$, which can range from about 10 μm to about 50 μm. In one embodiment, adjacent raised pixel oxide features 252 have a 33 μm pitch in both x- and y-directions, which creates air gaps (described below) that effectively insulate the pixel die 204 from the logic die 208. In some embodiments, the x-direction pitch $P_p$ may vary from the y-direction pitch $P_p$. In some embodiments, the pitch $P_p$ may vary across the pixel die 204.

Similar to the pixel oxide array 236, the logic oxide array 240 is formed from a plurality of raised logic oxide features 256 (e.g., 256a and 256b) that extend away from the logic die 208 (hidden in FIG. 3) by a height $H_l$ of about 0.25 μm to about 1.75 μm. In the illustrated embodiment, the raised logic oxide features 256 form a grid having a plurality of logic oxide vertices, although in other embodiments, the raised logic oxide features form non-grid shapes. In the illustrated embodiment, the raised logic oxide features 256 also form an outer frame (where 240 points in FIG. 2A) that surrounds the grid and provides a foundation for the pixel oxide array. Some embodiments may not include an outer frame. The raised logic oxide features 256 may be formed by an etching process, a deposition process, or another process. An exemplary process for forming the raised logic oxide features 256 is described below. In an embodiment, each raised logic oxide feature 256 has a height $H_l$ of about 0.5 μm. Each raised logic oxide feature 256 has a width $W_l$ of about 2.0 μm to about 5.0 μm. In an embodiment, each raised logic oxide feature 256 has a width $W_l$ of about 3.0 μm. In some embodiments, different raised logic oxide features 256 may have different heights $H_l$, widths $W_l$, and/or other dimension across the logic die 208, and/or relative to features of the pixel oxide array 236. Adjacent raised logic oxide features 256 are spaced apart by pitch $P_1$, which can range from about 10 μm to about 50 μm. In one embodiment, adjacent raised logic oxide features 256 have a 33 μm pitch in both x- and y-directions. In some embodiments, the x-direction pitch $P_1$ may vary from the y-direction pitch $P_1$. In some embodiments, the pitch $P_1$ may vary across the logic die 208. Any of the advantages described above with respect to specific dimensions of the raised pixel oxide features also apply to raised logic oxide features having those dimensions.

Referring still to FIG. 3, the pixel die 204, logic die 208, pixel oxide array 236, and logic oxide array 240 at least partially define a plurality of fluidly connected air gaps 248 (e.g., 248d and 248e). Each air gap 248 is a void between the pixel die 204 and the logic die 208. Adjacent air gaps 248 are separated in the x- and y-directions by the raised pixel oxide features 252 and the raised logic oxide features 256. In one sense, each air gap 248 extends in the z-direction from the pixel die 204 to the logic die 208, and thus has a depth $G=H_p+H_l$. In another sense, each air gap 248 may be thought of as specific to the pixel die 204 or to the logic die 208, and thus has a z-direction depth of $H_p$; or $H_l$. Considered in the first way (i.e., $G=H_p+H_l$), each air gap has a depth G of at least about 1 μm, about 1 μm, about 2 μm, at least about 2 μm, or about 1 μm to about 3 μm. In some embodiments, the air gap 248 does not have a consistent depth G. In some embodiments, the plurality of air gaps includes two or more air gaps having a different depth G. To clarify, the present disclosure refers to a plurality of air gaps 248 to facilitate understanding. Because each air gap 248 is fluidly connected, the plurality of air gaps 248 may be considered a single air gap having a plurality of distinct areas that are at least partially demarcated by the raised pixel oxide features 252 and the raised logic oxide features 256.

Each air gap 248 is a thermal insulator between the pixel die 204 and the logic die 208. In particular, because air has a relatively low thermal conductivity (e.g., about 33.5 mW/m K at 400 K and atmospheric pressure) as compared to oxides, metals, and other solids, the space within each air gap 248 limits conduction of thermal energy from logic die 208 to pixel die 204. Although the term "air gap" is utilized throughout this disclosure, the inventive structures described herein are not limited to air gaps filled with air, per se. In some embodiments, a vacuum may exist within one or more air gaps 248. In some embodiments, non-air gases (e.g., inert gases) may occupy one or more air gaps 248.

Referring to FIG. 4, each air gap 248 (e.g., 248f-248j) allows convection to remove thermal energy from CIS 200 because it is fluidly connected to an external heat sink S (e.g., ambient air) via one or more other fluidly connected air gaps 248 and/or air channels 232. Whereas air gaps 248 are located within the pixel oxide array 236 and the logic oxide array 240, air channels 232 are located between adjacent outer bonds 224. In the illustrated embodiment, the air channels 232 are located in the outer region 226 of CIS 200, whereas air gaps 248 are located in the inner region 228 of CIS 200. In the illustrated embodiment, fluidly connected air gaps 248 are fluidly connected to heat sink S via air channels 232b and 232c. Line F represents the fluid flow path through the air gaps 248 to the heat sink S. In the illustrated embodiment, fluid connections extend through the pixel oxide array 236 and through the logic oxide array 240 in at least two dimensions: across the page (i.e., fluid flow path F) and into the page. Thus, the stacked chip architecture of the present disclosure utilizes both conduction and convection to limit heat transfer from the logic chip 208 to the pixel chip 204.

Figure 5:
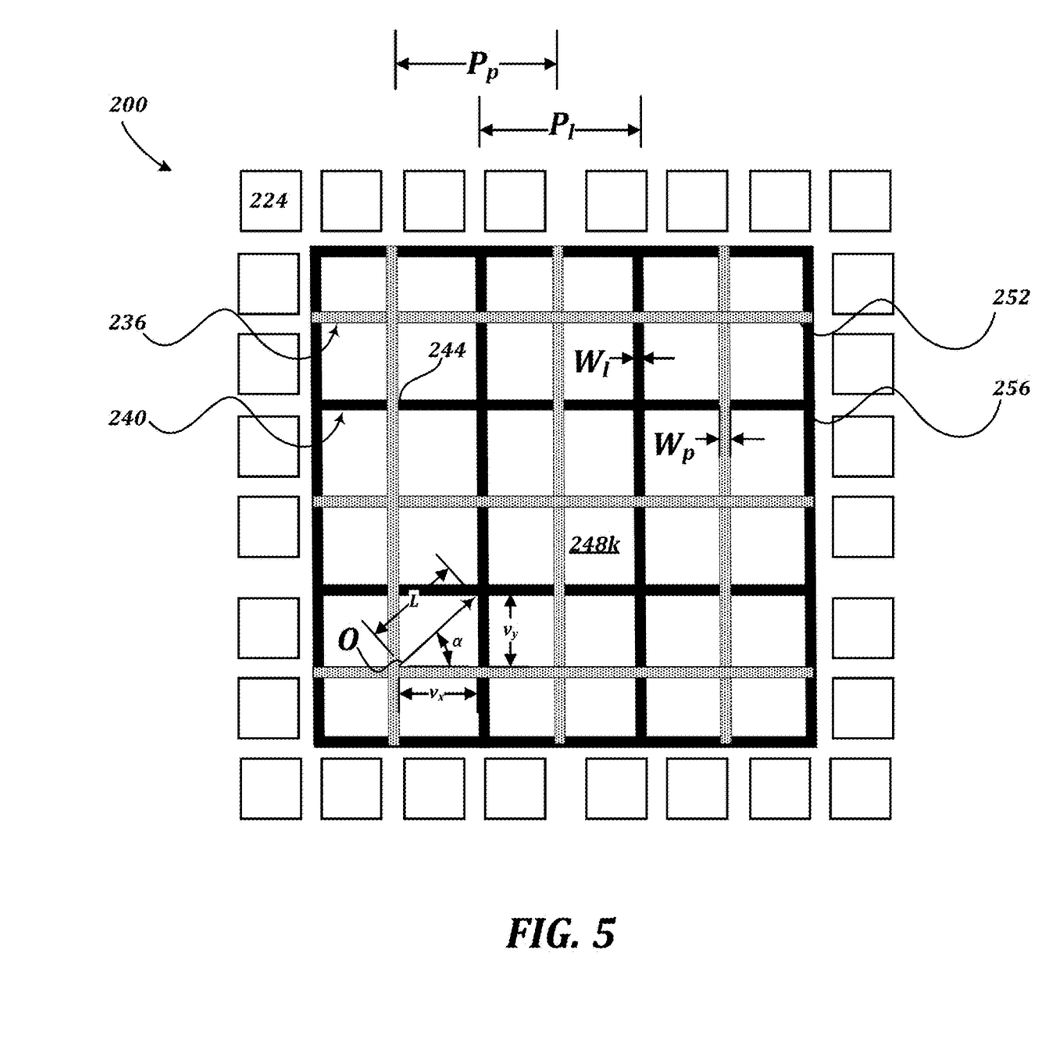
FIG. 5 shows a top schematic view of an example image sensor having stacked chip architecture in accordance with the teachings of the present disclosure.

FIG. 5 shows a top schematic view of a CIS 200 having stacked chip architecture in accordance with the present disclosure. The CIS 200 has pixel oxide array 236 and logic oxide array 240, and a plurality of air gaps 248 (e.g., air gap 248k). In the illustrated embodiment, air gap 248k (which is formed within the pixel oxide array 236) is fluidly connected to at least four separate and immediately adjacent air gaps 248 formed within the logic oxide array 240. As discussed above, the advantages of the air gaps 248 relate to the lower thermal conductivity of air (or other gaseous matter/vacuum between the pixel die 204 and the logic die 208) as compared to oxide and other solids. For this reason, the ability of the inventive structures to limit heat transfer between the logic die 208 and the pixel die 204 is inversely related to the inner bond overlap area, i.e., the sum of the areas of inner bonds 244. The inner bond overlap area is the area through which thermal energy can be conducted from the logic die 208 to the pixel die 204 via the solid inner bonds 244.

To limit thermal conduction from the logic die 208 to the pixel 204, the inner bond overlap area can be reduced. To reduce the inner bond overlap area, one or more of the following variables may be decreased: the raised pixel oxide feature width Wp and the raised logic oxide feature width $W_l$. Additionally or alternatively, to reduce the inner bond overlap area, one or more of the following variables may be increased: the raised pixel oxide feature pitch Pp and the raised logic oxide feature pitch $P_l$. For example, increasing the raised pixel oxide feature pitch Pp may result in fewer raised pixel oxide features 252 in the pixel oxide array, thereby reducing the inner bond overlap area. Likewise, increasing the raised logic oxide feature pitch $P_l$ may result in fewer raised logic oxide features 256 in the pixel oxide array. In an embodiment, $P_p$ and $P_l$ are each 33 um, and each of $W_p$ and $W_l$ are about 3 μm.

The inner bond overlap area can also be reduced by offsetting the pixel oxide array 236 relative to the logic oxide array 240. Specifically, the pixel oxide array 236 can be offset relative to the logic oxide array 240 along an offset vector O, which has an offset length L and an offset angle α. The offset length L can be represented by a x-component ($V_x$) and a y-component ($V_y$). Thus, $L=\sqrt{Vx^2+Vy^2}$. $V_x$ and $V_y$ can each range from about 0.1 $P_p$ (or 0.1 $P_l$) to about 0.9 $P_p$ (or 0.9 $P_l$). Similarly, the offset length L can range from about 0.1 $P_p$ (or 0.1 $P_l$) to about 0.9 $P_p$ (or 0.9 $P_l$). For example, the offset length L can range from about 0.25 $P_p$ (or 0.25 $P_l$) to about 0.75 $P_p$ (or 0.75 $P_l$), e.g., about 0.5 $P_p$ (or 0.5 $P_l$). The offset angle α can range from about 15° to about 75°. In the non-limiting embodiment of FIG. 5, the offset vector V has a half-pitch shift, i.e., $V_x$=0.5 $P_p$ and $V_y$=0.5 $P_p$. Therefore, offset angle α=45°. This arrangement advantageously reduces the inner bond overlap area to those areas where the pixel oxide array 236 intersects the logic oxide array 240 (e.g., at inner bond 244). The foregoing example is non-limiting, and other embodiments may have different attributes, including different $V_x$, $V_y$, and/or α. In any embodiment with a given $W_p$, $W_l$, $P_p$, and $P_l$, the pixel oxide array 236 may be offset relative to the bond oxide array 240 to reduce or minimize the inner bond overlap area.

Figure 6:
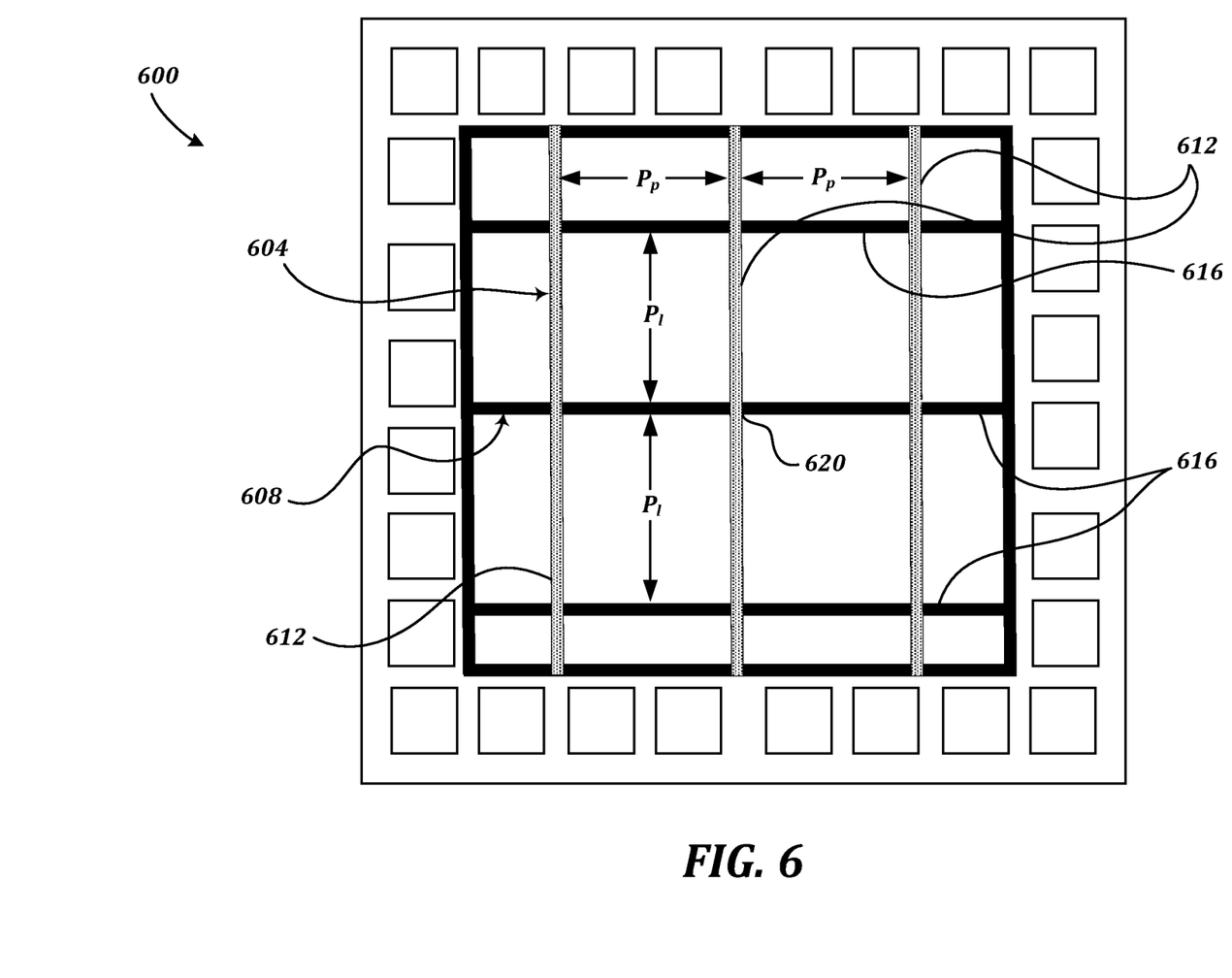
FIG. 6 shows a top schematic view of another example image sensor having stacked chip architecture in accordance with the teachings of the present disclosure.

FIG. 6 shows a top schematic view of another image sensor 600 having stacked chip architecture in accordance with the teachings of the present invention. The image sensor 600 has a pixel oxide array 604 and a logic oxide array 608, which are similar to the pixel oxide array 236 and logic oxide array 240 described above, respectively. The pixel oxide array 604 includes a plurality of raised pixel oxide features 612. The logic oxide array 608 includes a plurality of raised logic oxide features 616. As noted above, the raised pixel oxide features and the raised logic oxide features may form non-grid shapes. In this embodiment, the raised pixel oxide features 612 form a plurality of vertical "stripes." Likewise, the raised logic oxide features 616 form a plurality of horizontal "stripes." This configuration reduces the number of inner bonds 620, which advantageously reduces the inner bond overlap area for improved insulation between the pixel die and the logic die.

Figure 7:
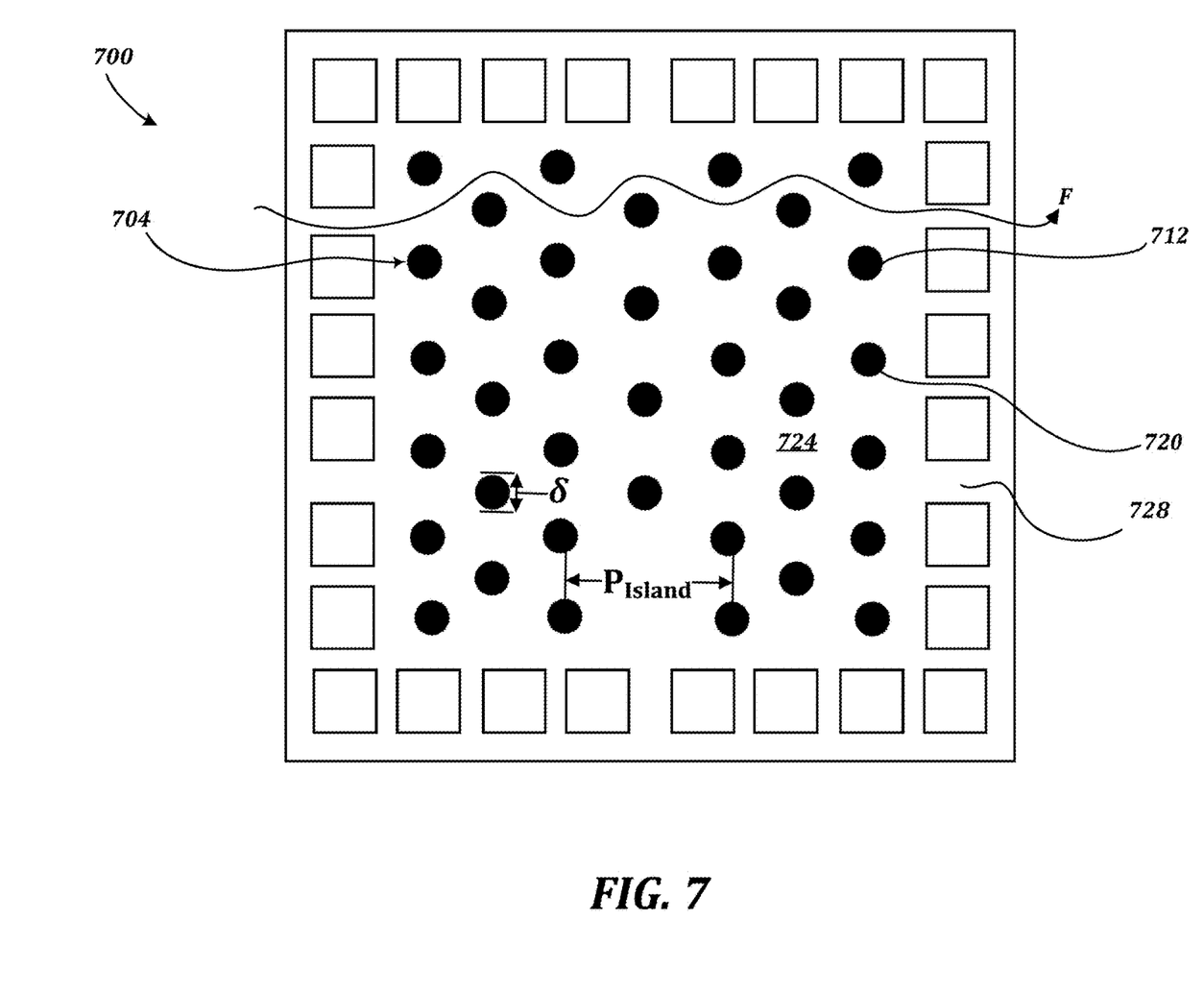
FIG. 7 shows a top schematic view of yet another example image sensor having stacked chip architecture in accordance with the teachings of the present disclosure.

FIG. 7 shows a top schematic view of another image sensor 700 having stacked chip architecture in accordance with the teachings of the present invention. The image sensor 700 has a pixel oxide array 704, which is similar to the pixel oxide array 236 described above. Image sensor 700 also has a logic oxide array, which is located behind the pixel oxide array 704. As with the other embodiments, the pixel oxide array 704 and the logic oxide array include a plurality of raised pixel oxide features 712 and a plurality of raised logic oxide features, respectively. In this embodiment, the raised pixel oxide features 712 and the raised logic oxide features form a plurality of "islands" having a rounded shape that facilitate fluid flow. Each pixel oxide island (e.g., formed by raised pixel oxide feature 712) forms an inner bond 720 with a logic oxide island. Each island has a diameter δ of about 2 μm to about 5 μm and is spaced apart from adjacent islands by pitch P of about about 10 μm to about 50 μm. This configuration facilitates convection heat transfer from the image sensor 700 because the pixel oxide array 704 and logic oxide array present a reduced barrier to fluid flow (e.g., as shown by arrow F). Thus, it is easier for air to flow through the air gaps 724 and air channels 728. In some embodiments, the plurality of islands includes islands having two or more different diameters δ. In some embodiments, the plurality of islands includes islands having two or more different shapes (e.g., square, ovular, circular, or other shape). In some embodiments, the plurality of islands includes islands that are spaced apart by two or more different pitches P. Thus, the size and location of islands can be optimized based upon the location of one or more heat sources in the image sensor 700.

Figure 8:
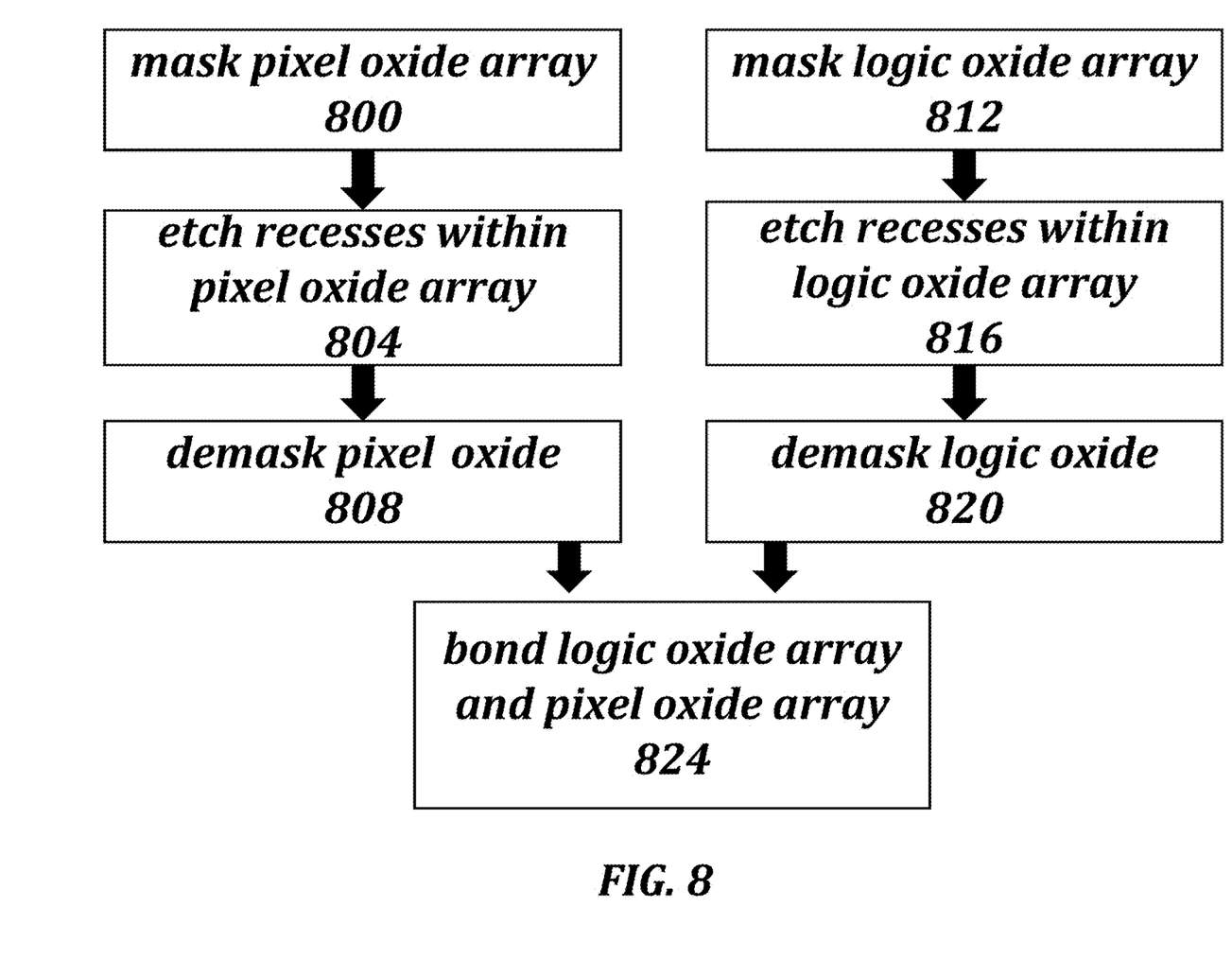
FIG. 8 shows an example method for preparing image sensors having stacked chip architecture in accordance with the teachings of the present disclosure.

FIG. 8 shows one non-limiting method for preparing a pixel die having a pixel oxide array as described above, and a logic die having a logic oxide array as described above, wherein the pixel oxide array and the logic oxide array form a plurality of inner bonds between the pixel die and the logic die. The pixel die may be prepared before, simultaneously with, or after preparing the logic die.

To prepare the pixel oxide array, a pixel die having an oxide layer on the bond side is provided. At step 800, a mask is then applied to an inner region of the pixel die on the bond side, the mask having the negative profile of the pixel oxide array to be formed. In other words, the mask covers parts of the oxide that will form the raised pixel oxide features. Accordingly, the mask may define the characteristics of the raised pixel oxide features, including size, location, and spacing. In an embodiment, the mask defines Wp and Pp. In an embodiment, the mask defines $δ_p$ and $P_{Island}$. At step 804, one or more etchants and etching steps are then utilized to etch a plurality of recesses in the oxide layer of the pixel die, the recesses corresponding to the areas not covered by the mask. The recesses may be etched to a depth Hp. At step 808, after etching, the mask is removed from the pixel die.

Similarly, preparing the logic oxide array entails a similar process to the pixel oxide array. A logic die having an oxide layer on the bond side is provided. At step 812, a mask is then applied to an inner region of the logic die on the bond side, the mask having the negative profile of the logic oxide array to be formed. Accordingly, the mask may define the characteristics of the raised logic oxide features, including size, location, and spacing. In an embodiment, the mask defines $W_l$ and $P_l$. In an embodiment, the mask defines $\delta_l$. At step 816, one or more etchants and etching steps are then utilized to etch a plurality of recesses in the oxide layer of the logic die, the recesses corresponding to the areas not covered by the mask. The recesses may be etched to a depth $H_l$. At step 820, after etching, the mask is removed from the logic die.

At step 824, the pixel oxide array and the logic oxide array are then bonded together to form a plurality of inner bonds as described above, such that each recess etched into the oxide layer of the pixel die is fluidly connected to at least one recess etched into the oxide layer of the logic die, and vice versa. Thus, the method produces a semiconductor device having stacked architecture, with a plurality of fluidly-connected air gaps separating the logic die from the pixel die. In an embodiment, bonding the pixel oxide array to the logic oxide array creates a fluid connection between a) an air channel between a plurality of adjacent outer bonds and b) the plurality of air gaps. In an embodiment, the method includes utilizing a mask that masks both the logic oxide array (or the pixel oxide array) and an air channel between a plurality of adjacent outer bonds.

The foregoing process describes the steps necessary to prepare the plurality of inner bonds between the pixel oxide array and the logic oxide array in order to create a plurality of fluidly-connected air gaps. The foregoing process is not intended to limit semiconductor formation processes to only those steps. Rather, one or more additional and optional processing steps may precede or follow any of the steps described above.

As compared to known stacked chip architectures—including those having uniform oxide contact between and across the dies, and those that include a metallic layer between dies—the inventive stacked chip architectures of the present disclosure significantly reduce heat transfer between the logic die (heat source) and the pixel die. This reduced heat transfer advantageously reduces Dark Image Non-Uniformity (DINU).

Figure 9A:
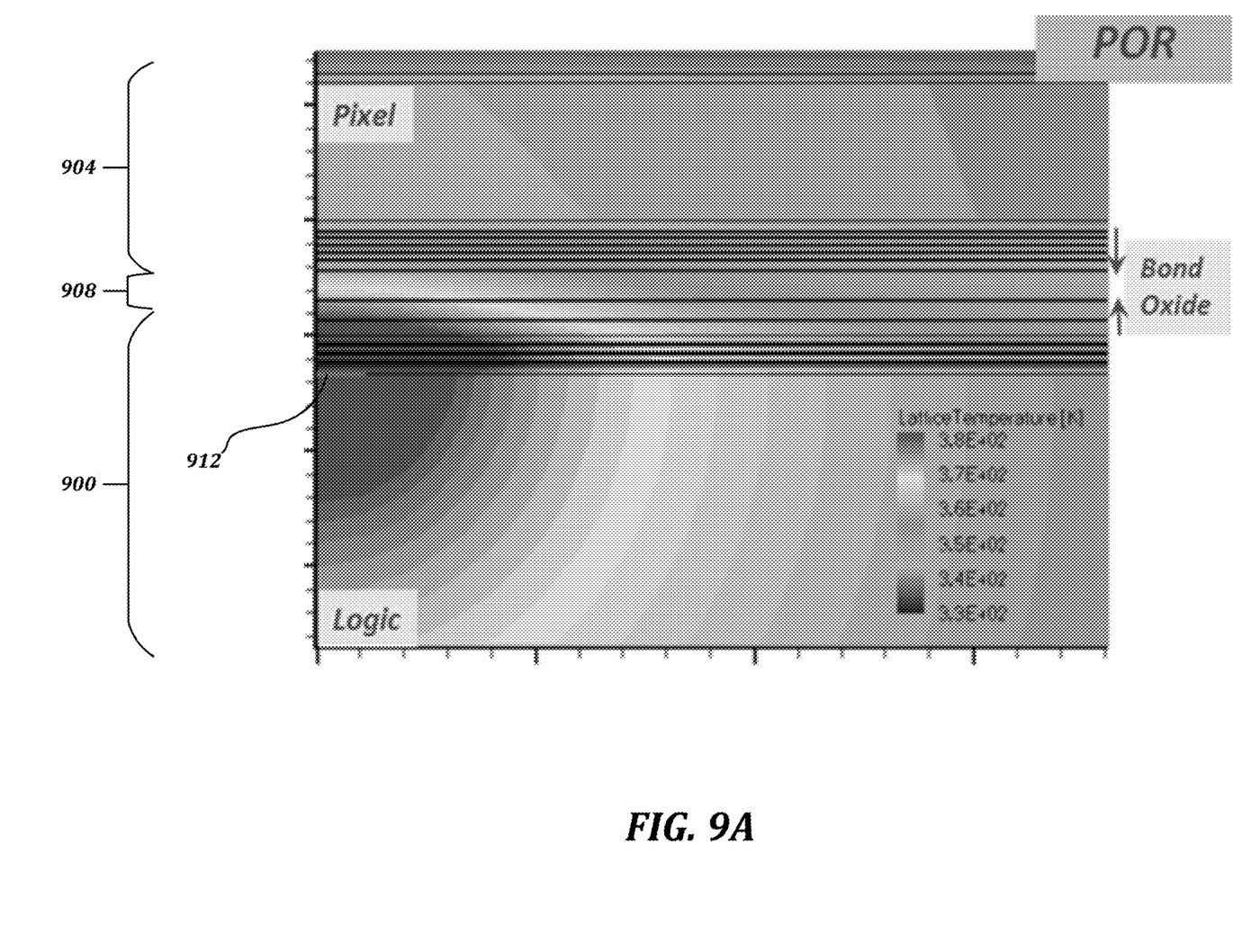
FIG. 9A illustrates a thermal simulation for an example image sensor constructed without a plurality of fluidly connected air gaps.

FIG. 9A illustrates a thermal simulation for an image sensor constructed without the plurality of fluidly connected air gaps taught by the present disclosure. For reference, Appendix A-1 shows FIG. 9A in color. The simulation shows the temperature variation between (and across) a logic die 900 and a pixel die 904 bonded together by a uniform oxide layer 908. A heat source 912 is located on the logic chip 900 in the middle-left side of the simulation. Accordingly, temperatures are highest at the heat source 912, i.e., ~380 K. Due to conduction of thermal energy from the heat source 912 to the pixel die 904, temperatures in the pixel die 904 vary from ~345 K (12 K above ambient temperature 333 K) nearest the heat source 912 to about ~343 K. The temperature 100 μm away from heat source is 337.5 K; in other words, $\Delta T=7.5$ K.

Figure 9B:
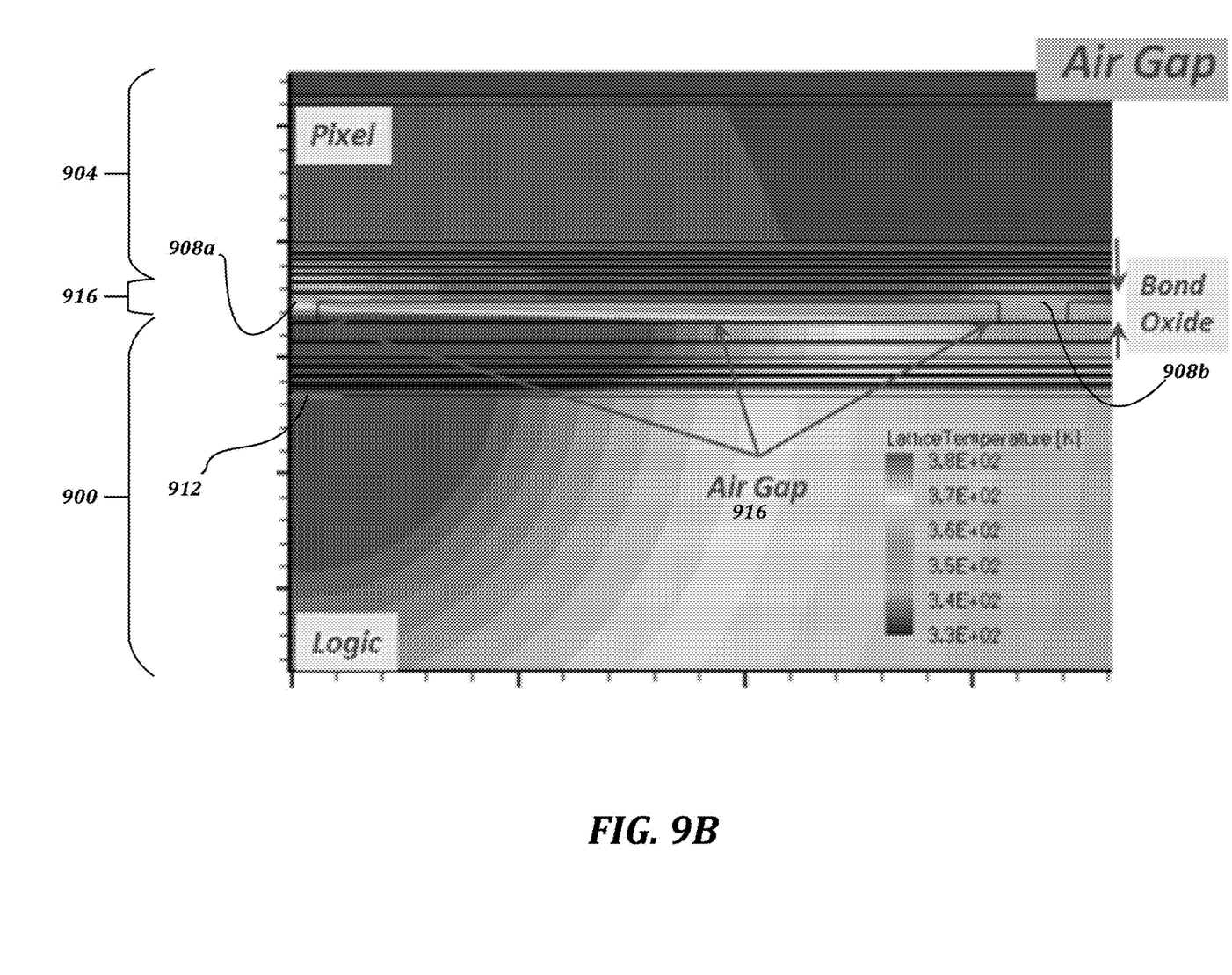
FIG. 9B illustrates a thermal simulation for an example image sensor constructed with an air gap between a logic die and a pixel die, in accordance with the teachings of the present disclosure.

FIG. 9B illustrates a thermal simulation for an image sensor constructed with an air gap 916 between the logic die 900 and the pixel die 904, as taught by the present disclosure. For reference, Appendix A-2 shows FIG. 9B in color. In this embodiment, the oxide layer is not uniform across the pixel die 904. Rather, the oxide layer includes two raised oxide features 908a, 908b that are separated by the air gap 916. As can be seen from the darker coloration of the pixel die 904 as compared to FIG. 9A, temperatures across the pixel die 904 are significantly lower than in the simulation of FIG. 9A. In particular, temperatures in the pixel die 904 generally do not exceed ~337 K (4 K above ambient temperature 333 K) except in a very isolated location next to the heat source 912—a 67% improvement. In other words, $\Delta T=2.1$ K—a 70% reduction.

Dark Image Non-Uniformity (DINU) is a function of dark current (DC), which decreases in a non-linear (exponential) relationship as temperature decreases. Therefore, relatively small temperature reductions on the pixel die 904 cause exponential reductions in DC and DINU. For this reason, the image sensor simulated in FIG. 9B reduces DINU across the pixel die 904 by approximately 70% as compared to the image sensor simulated by FIG. 9A. This impressive reduction in DINU results from the air gap 916, which insulates the pixel die 904 from the heat source 912. Accordingly, image sensors of the present disclosure perform significantly better than known image sensors.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

The embodiments of the invention in which an exclusive property or privilege is claimed are defined as follows:

1. An image sensor, comprising:
    a logic die, comprising:
    a function logic element disposed on a bond side of the logic die; and
    a logic oxide array of raised logic oxide features disposed on the bond side of the logic die;
    a pixel die that is stacked on top of the logic die, the pixel die comprising:
    a pixel array disposed on a light receiving side of the pixel die; and
    a pixel oxide array of raised pixel oxide features disposed on a bond side of the pixel die;
    a plurality of outer bonds disposed between an outer region of the logic die and an outer region of the pixel die; and
    a plurality of inner bonds formed at an inner region of the image sensor between the pixel oxide array and the logic oxide array, the inner bonds being spaced apart by a plurality of fluidly connected air gaps extending between the logic die and the pixel die,
    wherein the raised logic oxide features comprise a plurality of logic oxide stripes and the raised pixel oxide features comprise a plurality of pixel oxide stripes, wherein no logic oxide stripe extends in the same direction as any pixel oxide stripe.

2. The image sensor of claim 1, wherein the raised logic oxide features form the plurality of logic oxide stripes and the raised pixel oxide features form the plurality of pixel oxide stripes that overlap the plurality of logic oxide stripes by an inner bond overlap amount.

3. The image sensor of claim 2, wherein each raised pixel oxide feature and each raised logic oxide feature has a width W between about 2 μm to about 5 μm.

4. The image sensor of claim 2, wherein adjacent raised pixel oxide features are spaced apart by a pitch $P_p$ and adjacent raised logic oxide features are spaced apart by a pitch Pl.

5. The image sensor of claim 4, wherein the pitch $P_p$ is about 10 μm to about 50 μm and the pitch $P_l$ is about 10 μm to about 50 μm.

6. The image sensor of claim 1, wherein each fluidly connected air gap has a depth G measured between the logic die to the pixel die of about 1 μm to about 3 μm.

7. The image sensor of claim 6, wherein the depth G is measured from the logic die to the pixel die.

8. The image sensor of claim 6, wherein each raised logic oxide feature has a first height and each raised pixel oxide feature has a second height, wherein a sum of the first height and the second height equals the depth G.

9. The image sensor of claim 1, wherein the plurality of fluidly connected air gaps is configured to limit conduction of thermal energy from the logic die to the pixel die, and to permit convection through the plurality of fluidly connected air gaps.

10. The image sensor of claim 1, wherein each air gap is fluidly connected with at least one air channel located between adjacent outer bonds, the at least one air channel having a width of about 150 μm to about 2000 μm.

11. The image sensor of claim 1, wherein the inner region of the image sensor encompasses the pixel array.

12. An image sensor, comprising:
a logic die, comprising:
a function logic element disposed on a bond side of the logic die; and
a logic oxide array of raised logic oxide features disposed on the bond side of the logic die;
a pixel die stacked on top of the logic die, the pixel die comprising:
a pixel array disposed on a light receiving side of the pixel die; and
a pixel oxide array of raised pixel oxide features disposed on a bond side of the pixel die;
a plurality of outer bonds disposed between an outer region of the logic die and an outer region of the pixel die; and
a plurality of inner bonds formed at an inner region of the image sensor between the pixel oxide array and the logic oxide array, the inner bonds being spaced apart by a plurality of fluidly connected air gaps extending between the logic die and the pixel die,
wherein each fluidly connected air gap has a depth G measured between the logic die and the pixel die of about 1 μm to about 3 μm, each fluidly connected air gap is fluidly connected with at least one air channel located between adjacent outer bonds, the at least one air channel having a width of about 150 μm to about 2000 μm, wherein each raised logic oxide feature and each raised pixel oxide feature has a width W of about 2 μm to about 5 μm, adjacent raised pixel oxide features are spaced apart by a pitch $P_p$, and adjacent raised logic oxide features are spaced apart by pitch Pl, and
wherein the raised logic oxide features comprise a plurality of logic oxide stripes and the raised pixel oxide features comprise a plurality of pixel oxide stripes, wherein no logic oxide stripe extends in the same direction as any pixel oxide stripe.

13. The image sensor of claim 12, wherein the pitch $P_p$ is about 10 μm to about 50 μm and the pitch $P_l$ is about 10 μm to about 50 μm.

* * * * *